(12) United States Patent
Mallikarjunaswamy

(10) Patent No.: US 9,373,682 B2
(45) Date of Patent: Jun. 21, 2016

(54) COMPACT GUARD RING STRUCTURE FOR CMOS INTEGRATED CIRCUITS

(71) Applicant: Alpha and Omega Semiconductor Incorporated, Sunnyvale, CA (US)

(72) Inventor: Shekar Mallikarjunaswamy, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/320,462

(22) Filed: Jun. 30, 2014

(65) Prior Publication Data

US 2015/0380483 A1    Dec. 31, 2015

(51) Int. Cl.
*H01L 29/06*    (2006.01)
*H01L 27/02*    (2006.01)

(52) U.S. Cl.
CPC ......... *H01L 29/0619* (2013.01); *H01L 27/0207* (2013.01)

(58) Field of Classification Search
CPC ............ H01L 2924/00; H01L 29/1083; H01L 29/1087; H01L 29/7835; H01L 27/0921; H01L 29/1095; H01L 29/66659; H01L 29/78; H01L 29/7816
USPC ........... 257/E21.427, E23.002, E29.063, 126, 257/335, 336, 618, 758; 327/109
See application file for complete search history.

(56) References Cited

U.S. PATENT DOCUMENTS

| | | | |
|---|---|---|---|
| 6,747,294 B1 | 6/2004 | Gupta et al. | |
| 6,924,531 B2 | 8/2005 | Chen et al. | |
| 8,106,514 B2 * | 1/2012 | Nakashiba | 257/758 |
| 2006/0226499 A1 * | 10/2006 | Shimizu | 257/409 |
| 2011/0241069 A1 * | 10/2011 | Vashchenko | H01L 27/0262 257/140 |
| 2013/0009272 A1 * | 1/2013 | Sakurai | H01L 21/84 257/496 |
| 2013/0265086 A1 * | 10/2013 | Chang et al. | 327/109 |

\* cited by examiner

*Primary Examiner* — David Vu
*Assistant Examiner* — Jonathan Han
(74) *Attorney, Agent, or Firm* — Van Pelt, Yi & James LLP

(57) ABSTRACT

An integrated circuit includes a guard ring structure including a guard ring with integrated well taps to reduce the silicon area required for the guard ring structure. In some embodiments, the guard ring structure includes an N-type guard ring surrounded by inner and outer P-type guard rings. The N-type guard ring is formed with interleaving deep N-wells and P-wells that are formed on an N-type buried layer and are electrically shorted together. The inner and outer P-type guard rings are formed in P-wells. The interleaving deep N-wells and P-wells of the N-type guard ring may be connected to ground or be left floating. By integrating P-well contacts in the N-type guard ring, P-well contacts, or P-taps, for the P-type guard ring can be eliminated.

20 Claims, 6 Drawing Sheets

COMPACT GUARD RING STRUCTURE FOR CMOS INTEGRATED CIRCUITS

BACKGROUND OF THE INVENTION

A monolithic Integrated Circuit (IC) includes multiple active devices built on a semiconductor substrate. Unintended parasitic devices are also formed which can result in undesirable crosstalk between devices. A CMOS integrated circuit built on a P-substrate often include a parasitic NPN transistor formed from the P-substrate, an N-well and another N region. Latch-up of the integrated circuit can occur when a PNPN structure formed due to the parasitic NPN transistor becomes triggered.

Latch-up can be a particularly serious problem for power integrated circuits incorporating high voltage switching devices and nominal voltage controller circuitry. Transient voltages during the switching of a power device on the power integrated circuit can end up forward biasing the emitter and base junction of the parasitic NPN transistor, resulting in injection of minority carriers into the substrate. Guard ring structures, which can be biased or unbiased, have been used to isolate a device or a circuit that introduces parasitic current in an integrated circuit. Guard ring structures are used to collect the undesired minority carriers injected into the substrate. For example, a guard ring is often used to surround an LDMOS transistor to collect minority carriers and to prevent latch-up.

Conventional guard ring structures are usually space consuming, requiring a large silicon area to implement. FIG. 1 illustrates a conventional double guard ring structure surrounding an active device. FIG. 2 is a cross-sectional view of the conventional double guard ring structure of FIG. 1 along the line A-A'. Referring to FIGS. 1 and 2, an integrated circuit 10 is formed on a P-substrate 12 with a P-type epitaxial layer 14 formed thereon. The conventional guard ring structure 16 typically includes an N-type guard ring formed by a deep N-well 20 surrounded on all sides by a P-type guard ring formed by a P-well 24. An N-well 18 may be formed in the deep N-well 20. The guard ring structure 16 surrounds the active device 22 to be protected. For example, the active device may be an N-type LDMOS transistor formed on an N-type buried layer 26. The N-type guard ring of the guard ring structure 16 collects minority carriers (electrons) that may be injected into the substrate 12 by the LDMOS transistor device 22. The P-type guard ring of the guard ring structure 16 further collects majority carriers (holes) that may be generated when electrons injected recombine before they get collected by the N-well 20.

In the case that the active device to be protected is formed on the edge of the integrated circuit, the guard ring may be formed in an U-shape to surround the inward facing sides of the active device 22, as shown in FIG. 1. The N-type guard ring (N-well/deep N-well 18, 20) may be left floating or connected to either the ground potential or connected to the positive power supply Vdd. N+ diffusion regions 30 are formed in the N-well/deep N-well to form ohmic contact with overlying contacts (not shown) and to reduce the well resistance. The P-type guard ring (P-well 24) is typically connected to ground using P+ diffusion regions to form ohmic contact with overlying contacts (not shown), also referred to as P-taps. In some cases, the P-wells of the P-type guard ring closer to the active device may be left floating while the P-wells of the P-type guard ring on the other side of the N-type guard ring may be connected to ground. As thus constructed, a parasitic NPN bipolar transistor is formed with the N-type guard ring as the collector, the substrate 12 as the base and the N-buried layer in the active device 22 as the emitter.

The conventional guard ring structure is space consuming, increasing the die size and the cost of the integrated circuit. In particular, the minimum spacing required between the P-type buried layer (PBL) 28 of the P-well 24 and the N-type buried layer (NBL) 26 of the N-type guard ring increases the silicon area required for implementing the guard ring structure.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a compact guard ring structure for a CMOS integrated circuit includes an N-type guard ring with integrated P-well taps to reduce the silicon area required for the guard ring structure. In some embodiments, the compact guard ring structure includes an N-type guard ring surrounded by inner and outer P-type guard rings. The N-type guard ring is formed with interleaving deep N-wells and P-wells that are formed on an N-type buried layer and are electrically shorted together. The inner and outer P-type guard rings are formed in P-wells. The interleaving deep N-wells and P-wells of the N-type guard ring may be connected to ground or be left floating. By integrating P-well contacts in the N-type guard ring, P-well contacts, or P-taps, for the P-type guard ring can be eliminated and the silicon area required to implement the guard ring structure is reduced. The die size for implementing the integrated circuit incorporating the compact guard ring structure can also be reduced.

In embodiments of the present invention, the compact guard ring structure is used to surround an active device where the active device may be formed at least partially over an N-type buried layer. The compact guard ring structure can be formed in a closed loop surrounding the active device to be protected. Alternately, in cases where the active device to be protected is formed on the edge of the integrated circuit, the compact guard ring structure may be formed as an open loop, such as in a C shape or an U-shape, to surround the inward facing sides of the active device.

Figure 1:
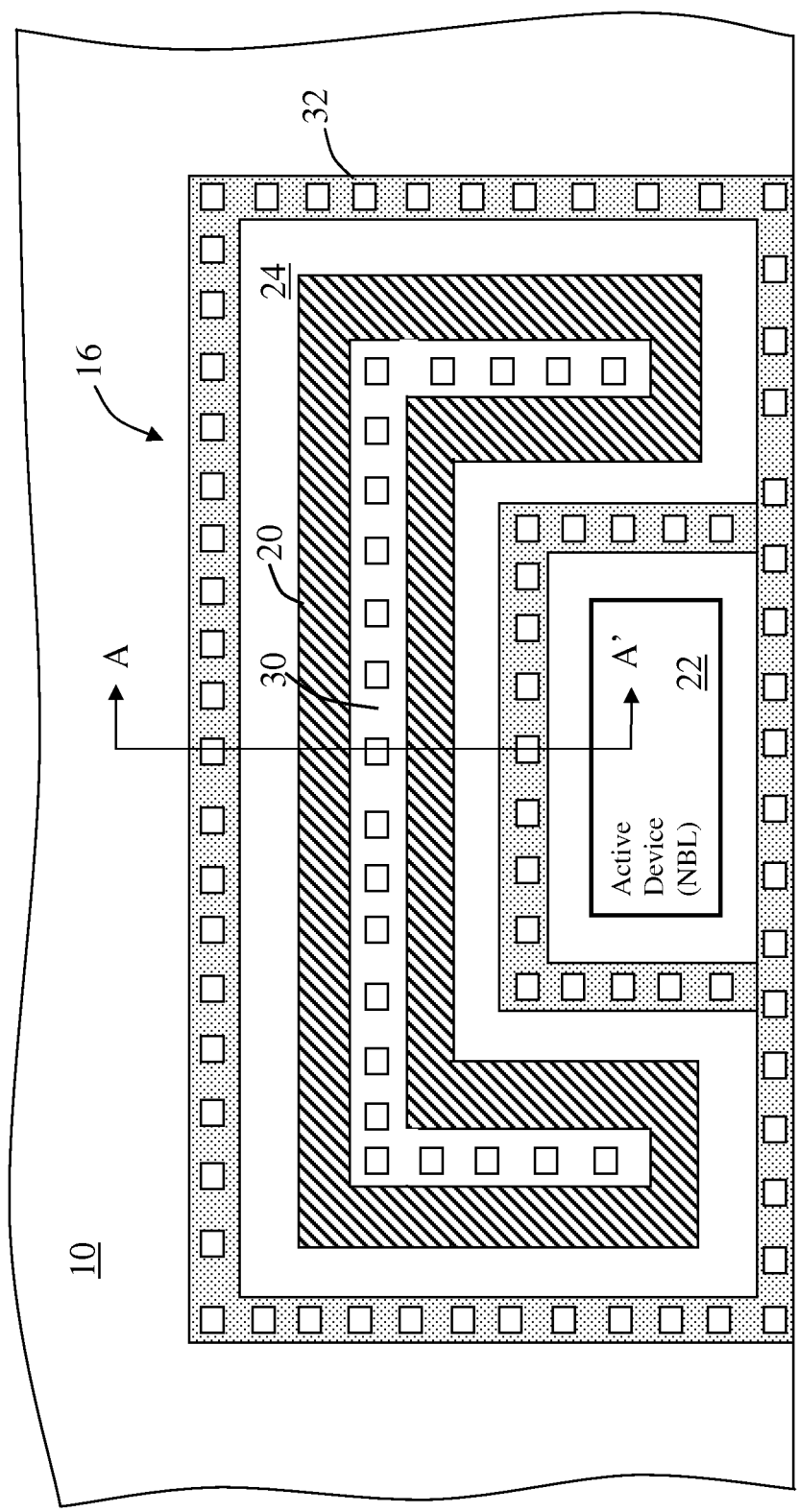
FIG. 1 illustrates a conventional double guard ring structure surrounding an active device.
Figure 2:
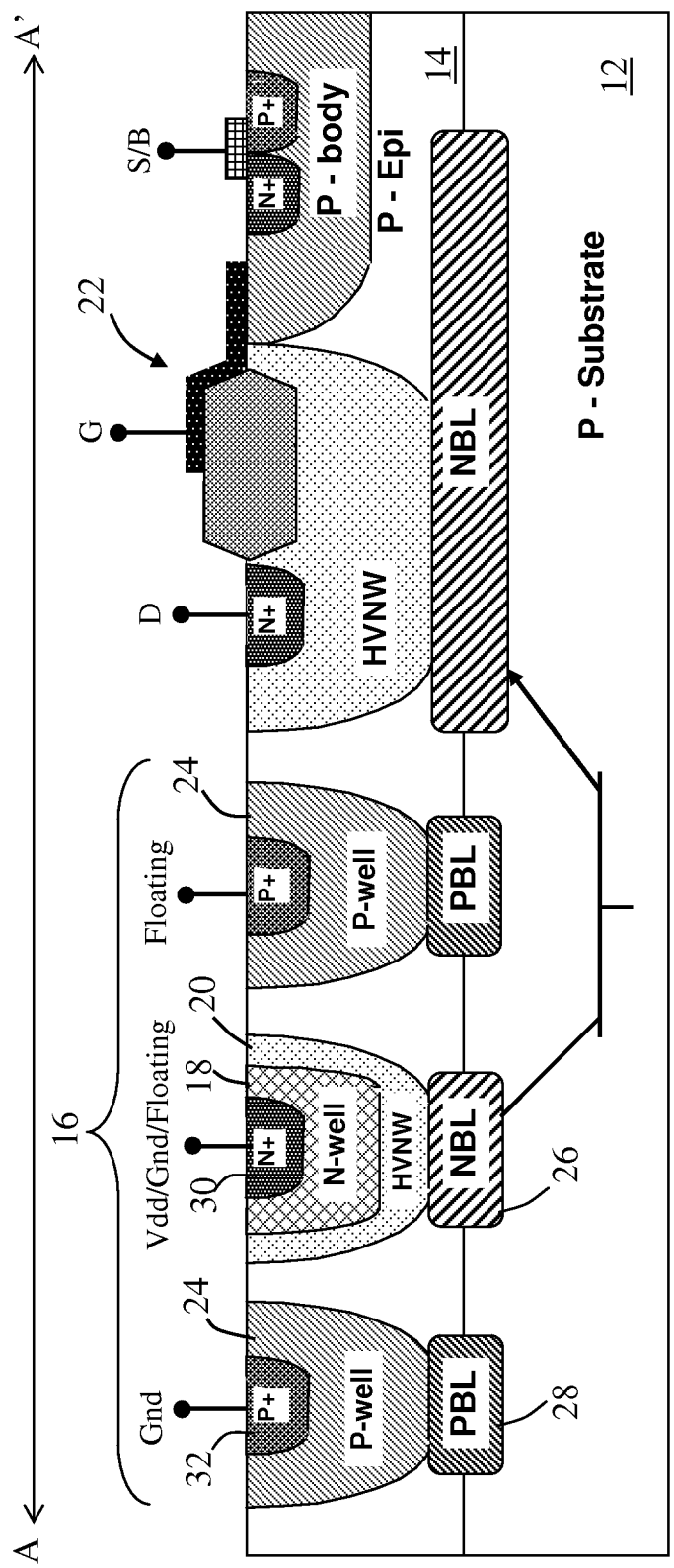
FIG. 2 is a cross-sectional view of the conventional double guard ring structure of FIG. 1 along the line A-A'.
Figure 3:
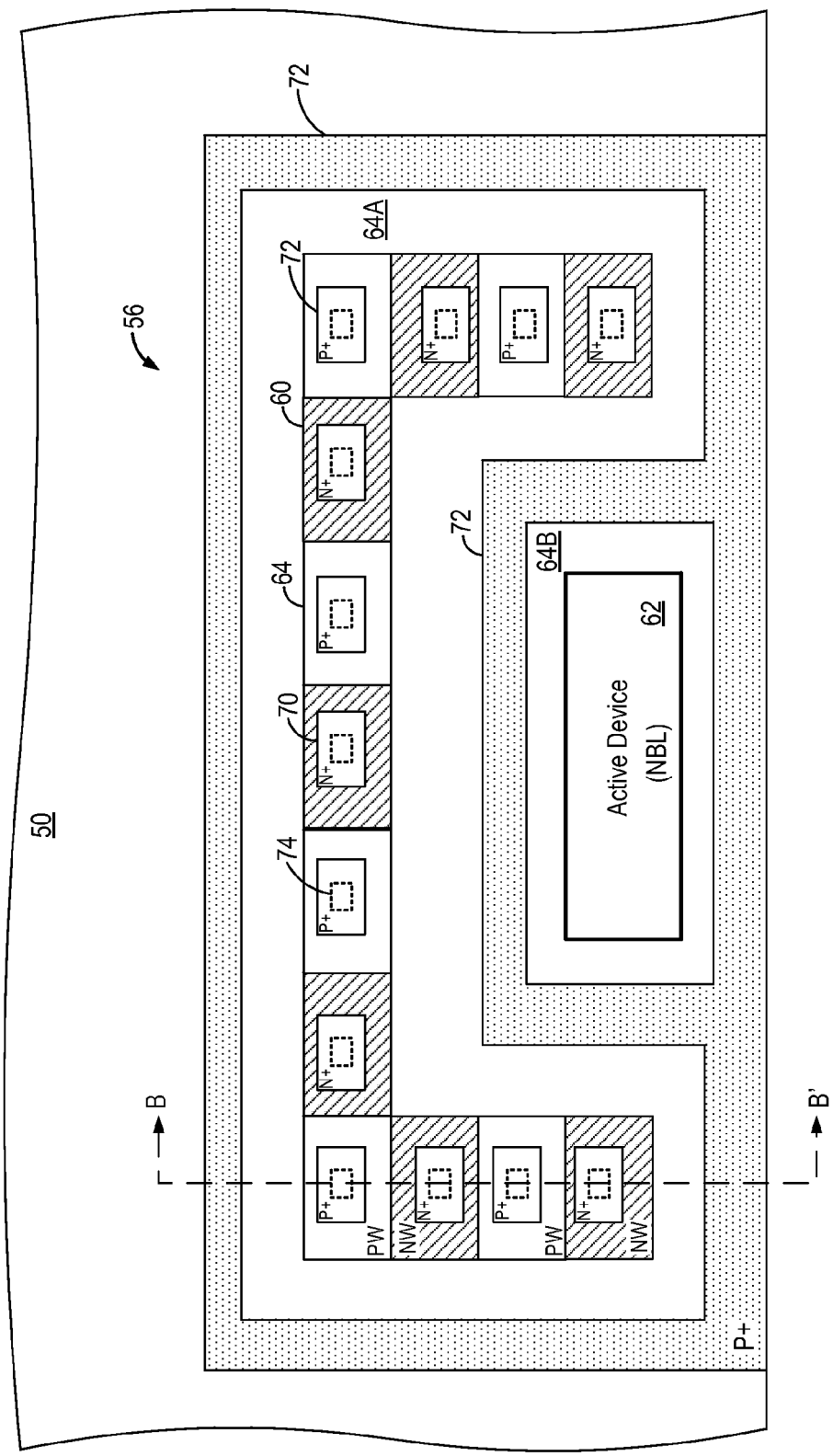
FIG. 3 is a top view of a compact guard ring structure in an integrated circuit in embodiments of the present invention.
Figure 4:
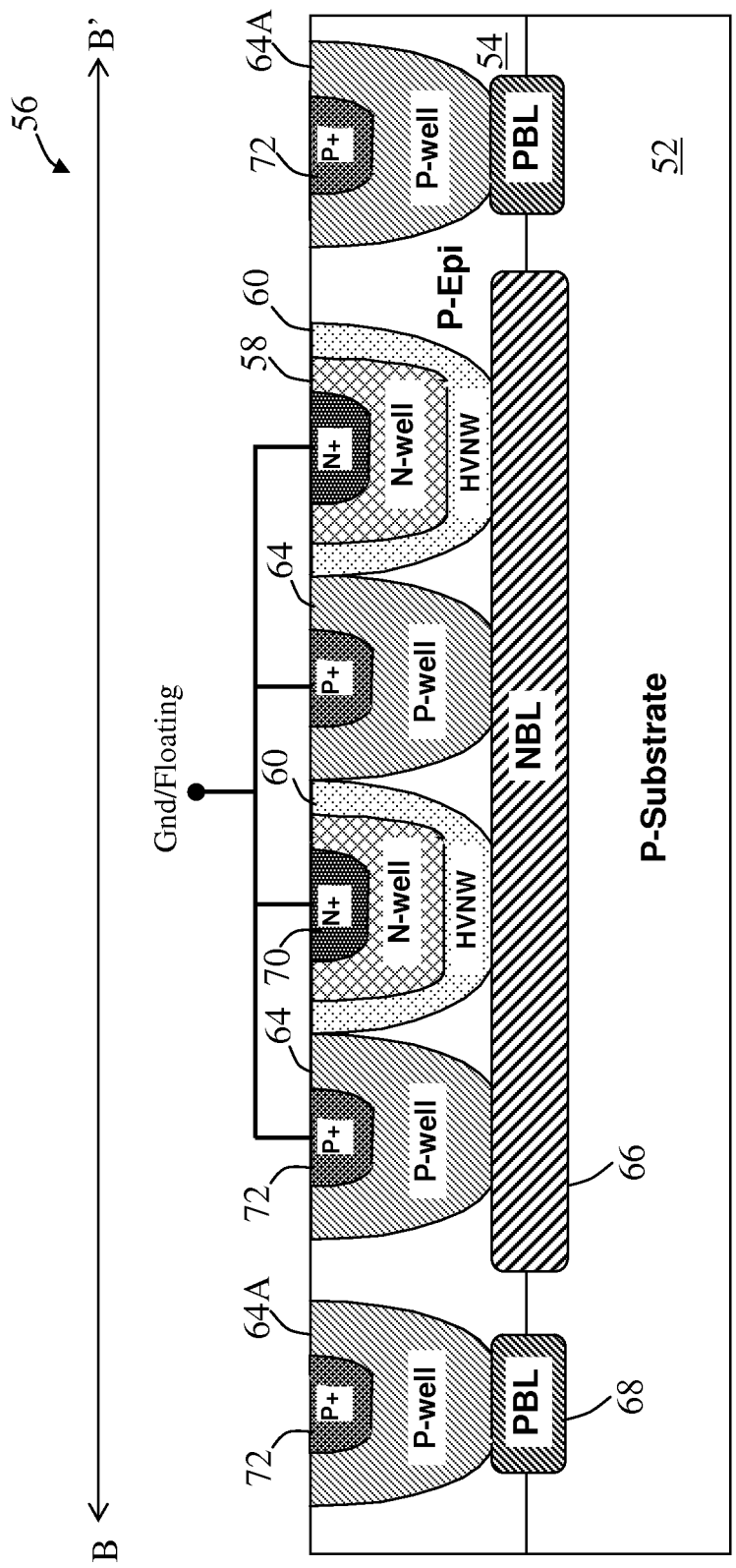
FIG. 4 is a cross-sectional view of the compact guard ring structure of FIG. 3 along the line B-B'.

FIG. 3 is a top view of a compact guard ring structure in an integrated circuit in embodiments of the present invention. FIG. 4 is a cross-sectional view of the compact guard ring structure of FIG. 3 along the line B-B'. Referring to FIGS. 3 and 4, an integrated circuit 50 is formed on a P-substrate 52 with a P-type epitaxial layer 54 formed thereon. A compact guard ring structure 56 is formed on the integrated circuit 50 to protect other sensitive devices formed on the integrated circuit from the injecting active device 62. The active device is formed at least partially over an N-type buried layer. In the present embodiment, the active device 62 is formed on the edge of the integrated circuit 50. Therefore, the guard ring structure 56 is formed as an open loop, such as an U-shape, to surround the inward facing sides of the active device 62, as shown in FIG. 3. In other embodiments, the compact guard ring structure can be formed in a closed loop to surround the active device to be protected on all sides, as will be explained in more detail below.

The compact guard ring structure 56 includes an N-type guard ring surrounded by an inner P-type guard ring and an outer P-type guard ring. The outer P-type guard ring is formed in a P-well 64A formed on a P-type buried layer 68. The inner P-type guard ring is formed in a P-well 64B also formed on a P-type buried layer. A heavily doped P+ diffusion region 72 is formed in the P-wells 64A and 64B to reduce the resistance of the P-wells.

In embodiments of the present invention, the N-type guard ring is formed by interleaving deep N-wells 60 and P-wells 64 all formed on an N-type buried layer 66. More specifically, the N-type guard ring is formed by alternating deep N-wells 60 and P-wells 64 so that each deep N-well 60 adjoins a P-well 64. In some embodiments, an N-well 58 is formed inside each deep N-well 60. In the present description, the deep N-well 60, sometimes referred to as a high voltage N-well, refers to an N-well that is formed deeper from the surface of the semiconductor body than the standard N-well 58 and is more lightly doped than the standard N-well 58. The deep N-well typically extends to the N-buried layer formed under the well. The deep N-well 60 is used for high voltage devices to sustain a higher breakdown voltage. Heavily doped N+ regions 70 are formed in each N-well 58 for providing ohmic contact to the N-wells. Heavily doped P+ regions 72 are formed in the P-wells 64 for providing ohmic contact to the P-wells 64.

In the present embodiments, P-wells are formed in the P-type epitaxial layer and may be spaced apart from the N-wells formed therein. In other embodiments, the P-wells can be formed as a blanket P-well where a P-well is formed everywhere that is not an N-well. In that case, the P-wells 64A and 64B abut the deep N-well 60 or the P-well 64 of the N-type guard ring.

In embodiments of the present invention, the deep N-wells 60 and the P-wells 64 forming the N-type guard ring are electrically shorted to each other and can be electrically connected to the ground potential or can be left floating. For example, contacts 74 can be formed in the N+ regions 70 and the P+ regions 72 of P-wells 64. A conductive layer (not shown), such as a metal layer, can be used to electrically connect the contacts 74 in the N-type guard ring. In some embodiments, the N-type guard ring is resistively shorted to the ground potential.

As thus constructed, direct electrical connection is made only to the N-type guard ring through contacts 74. The inner and outer P-type guard rings (P-wells 64A and 64B) do not include any contacts or P-taps and does not receive any direct electrical connection. More specifically, the P-wells 64A and 64B are not directly electrically connected to any electrical potential and is left floating. However, P-wells 64A/64B are biased to the same potential as P-wells 64 by its proximity to the P-well regions in the N-type guard ring. For instance, the P-well 64A may be resistively shorted to the P-wells 64 through the P-type epitaxial layer 54. Alternately, P-well 64A may be abutting P-well 64 at some locations and are electrically shorted to P-wells 64 by the physical contact.

A salient feature of the guard ring structure 56 of the present invention is that the guard ring structure 56 integrates the P-well contacts in the N-type guard ring to eliminate the needs to provide separate P-taps in the P-type guard rings. By eliminating the P-well contacts or P-taps to the P-type guard rings (P-wells 64A and 64B), silicon area for implementing the guard ring structure 56 is reduced and a compact guard ring structure can be realized.

Another feature of the guard ring structure 56 is that the deep N-wells in the N-type guard ring are electrically connected to the same electrical potential as the P-wells 64 and 64A. That is, the entire guard ring structure 56 is electrically connected to ground or is left floating. The deep N-wells 60 of the N-type guard ring are never connected to the positive power supply Vdd so that minimum spacing can be used between the N-type regions and P-type regions in the guard ring structure. As thus constructed, minority carriers (electrons) in the substrate 52 will be collected by the deep N-wells 60 of the N-type guard ring, acting as the collector of the parasitic NPN bipolar transistor. When the deep N-wells 60 are connected to ground or is left floating, the electrons will go to the ground potential. More specifically, the electrons collected by the deep N-wells 60 are converted to holes through the adjacent Pwell regions that are resistively connected to ground connection and the holes are then collected at the ground connection.

Figure 5:
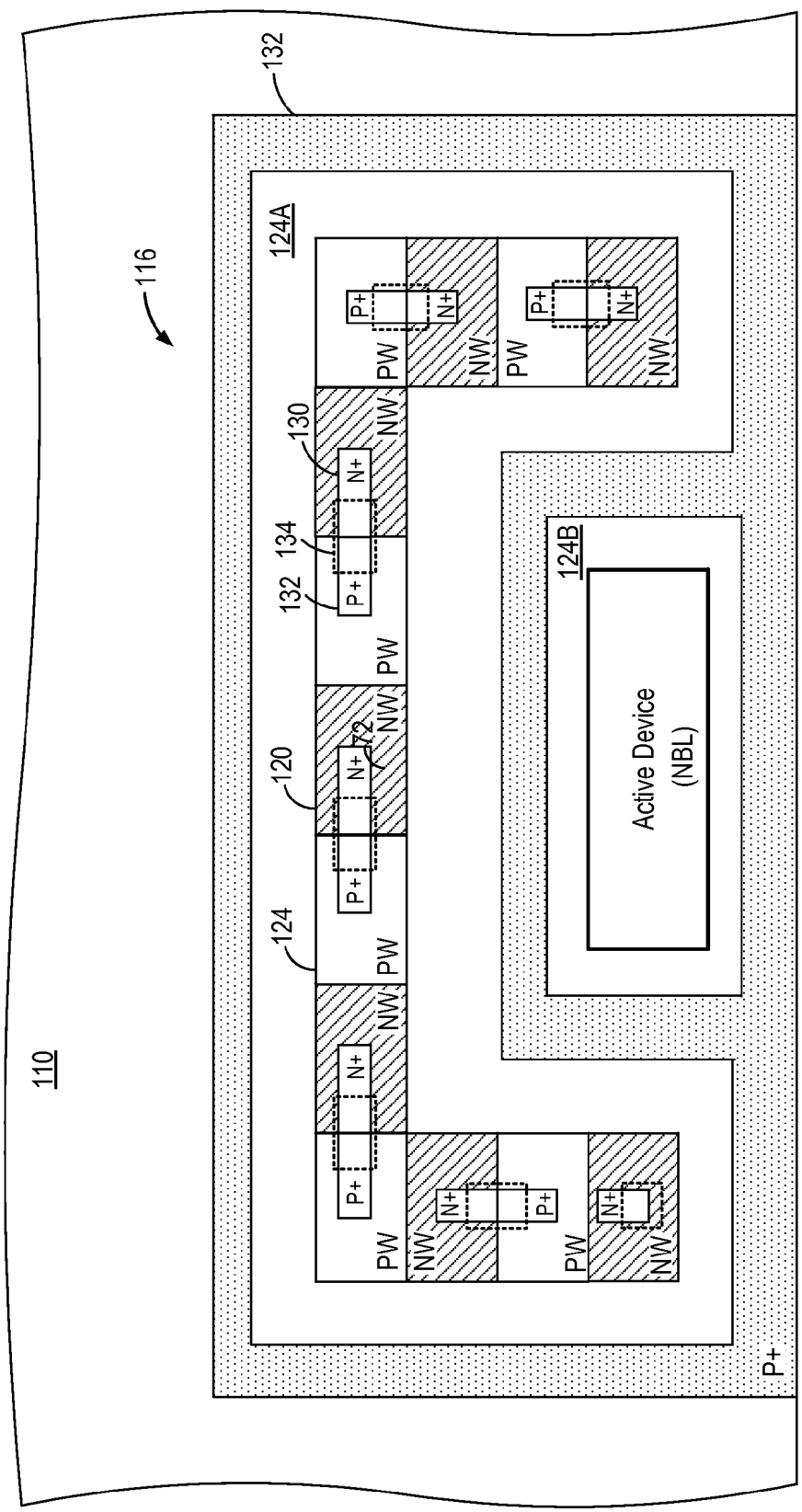
FIG. 5 is a top view of a compact guard ring structure in an integrated circuit in alternate embodiments of the present invention.

In embodiments of the present invention, the deep N-well 60 and the P-well 64 can be formed separated from each other or flushed or adjoining with each other. Furthermore, in the embodiment shown in FIG. 3, each deep N-well 60 and each P-well 64 includes a contact 74 to form the electrical connection to the N and P type regions. In other embodiments, when the deep N-well 60 and the P-well 64 are formed flushed or adjoining each other, butting contacts can be used to electrically connect the interleaving deep N-wells and the P-wells, as shown in FIG. 5. FIG. 5 is a top view of a compact guard ring structure in an integrated circuit in alternate embodiments of the present invention. Referring to FIG. 5, a compact guard ring structure 116 formed on an integrated circuit 110 includes an N-type guard ring formed with interleaving deep N-wells 120 and P-wells 124 on an N-type buried layer. The deep N-wells 120 and P-wells 124 are electrically shorted together using butting contacts 134. More specifically, N+ regions 130 formed in the deep N-wells 120 and P+ regions 132 formed in the P-wells 124 in a pair of adjoining deep N-well 120 and P-well 124 are formed adjacent to and abutting each other and a single butting contact 134 is formed to connect to both the N+ and the P+ regions. The N-type guard ring is surrounded by a P-type guard ring formed by P-well 124A on a P-type buried layer with a P+ region 132 formed in the P-well 124A. No well contacts or P-taps are needed for the outer P-well 124A or the inner P-well 124B. The P+ region 132 is formed in the outer P-well 124 and the inner P-well 124B to reduce the surface leakages due to increased surface threshold voltage.

Figure 6:
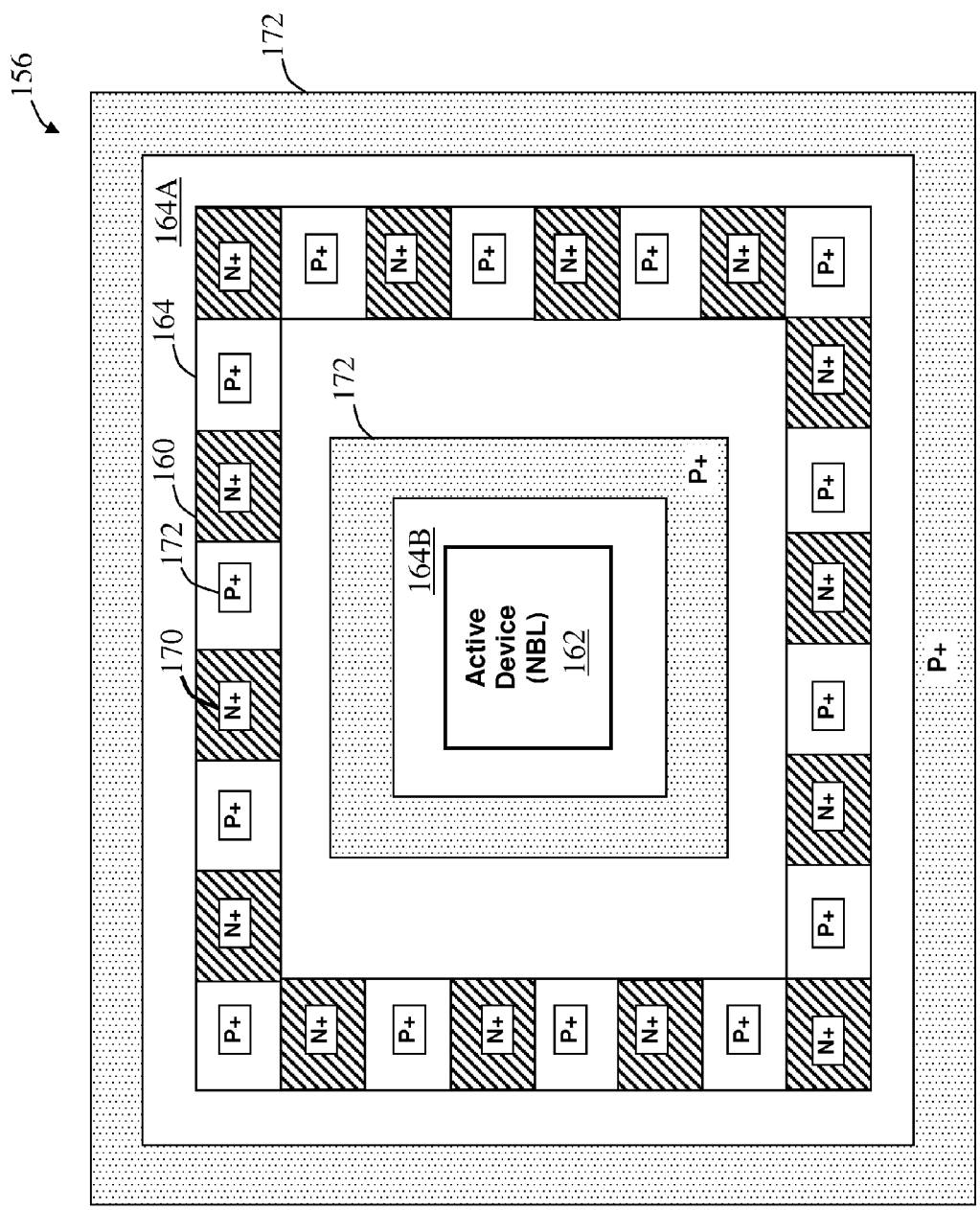
FIG. 6 is a top view of a compact guard ring structure in an integrated circuit in alternate embodiments of the present invention.

FIG. 6 is a top view of a compact guard ring structure in an integrated circuit in alternate embodiments of the present invention. FIG. 6 illustrates the compact guard ring structure 156 of the present invention being formed in a closed loop configuration to surround entirely an active device 162. The compact guard ring structure 156 of the present invention can be formed as concentric rings of an inner P-type guard ring (P-well 164B) encircling the active device 162, an N-type guard ring, and an outer P-type guard ring (P-well 164A). The N-type guard ring is formed with interleaving deep N-wells 160 and P-wells 164 formed on an N-type buried layer. The deep N-wells 160 and P-wells 164 are electrically connected together and can be floating or connect to ground. N+ regions are formed in the deep N-wells 160, which may also include an N-well. The inner and outer P-type guard rings are formed in P-wells 164A and 164B which are formed on a P-type buried layer. P+ regions are formed in the P-wells 164, 164A and 164B. Individual contacts (not shown) or butting contacts (not shown) may also be used to connect the deep N-wells and P-wells 164 in the N-type guard ring.

As thus constructed, the N-type guard ring integrates the P-well contacts so that the inner and outer P-type guard rings (P-well 164A and P-well 164B) do not need to include P-well contacts. In this manner, the compact guard ring structure 156 can be realized with reduced silicon area. It is imperative to note that the guard ring structure 56 of FIG. 3 and the guard ring structure 116 of FIG. 5 are merely part of the closed loop guard ring 156 of FIG. 6. When the active device 162 is formed at an edge of the integrated circuit, the guard ring structure becomes part of the closed loop guard ring 156. In the present embodiment, the guard rings can assume a circular shape or a polygon shape, such as a square. The use of the term "ring" does not restrict the guard ring to circular shape only.

Furthermore, in embodiments of the present invention, the N-type guard ring can be formed using multiple rows of contacts. For example, in FIGS. 3 and 5, a single row of contacts is shown. In other embodiments, the guard ring structures in FIGS. 3, 5 and 6 may include two or more rows of contacts or butting contacts to improve the electrical connection between the deep N-wells and the P-wells.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An integrated circuit, comprising:
    a semiconductor layer of a first conductivity type and being lightly doped;
    an active device formed in the semiconductor layer, the active device being formed at least partially on a first buried layer of a second conductivity type;
    a first guard ring of the first conductivity type formed in the semiconductor layer surrounding at least part of the active device;
    a second guard ring formed in the semiconductor layer surrounding the first guard ring and the active device and comprising first well regions of the first conductivity type interleaved with second well regions of the second conductivity type, the first well regions and the second well regions being interleaved to form alternating first and second well regions along a path where the second guard ring surrounds the first guard ring and the active device, the first well regions and the second well regions being formed on a second buried layer of the second conductivity type, the first and second well regions being electrically shorted together and electrically coupled to a ground potential or floating; and
    a third guard ring of the first conductivity type formed in the semiconductor layer surrounding the second guard ring,
    wherein the first and third guard rings do not receive direct electrical connection and are biased to the same electrical potential as the second well regions of the first conductivity type in the second guard ring.

2. The integrated circuit of claim 1, wherein the first, second and third guard rings form concentric closed loop rings surrounding the active device.

3. The integrated circuit of claim 1, wherein the first, second and third guard rings form concentric open loop rings surrounding at least part of the active device.

4. The integrated circuit of claim 1, wherein the first and third guard rings each comprises a well region of the first conductivity type formed on a third buried layer of the first conductivity type and a heavily doped region of the first conductivity type formed in the well region.

5. The integrated circuit of claim 1, wherein each of the second well regions of the second guard ring comprises a deep well region of the second conductivity type, the deep well region extending to the second buried layer, and a heavily doped region of the second conductivity type formed in the deep well region.

6. The integrated circuit of claim 5, wherein each of the second well regions of the second guard ring further comprises a standard well region of the second conductivity type formed in the deep well region, the heavily doped region of the second conductivity type being formed in the standard well region.

7. The integrated circuit of claim 5, wherein each of the first well regions of the second guard ring comprises a heavily doped region of the first conductivity type being formed in the first well region.

8. The integrated circuit of claim 7, wherein the second guard ring comprises contacts formed in electrical contact with the heavily doped regions of the first well regions and the second well regions and a conductive layer electrically connecting the contacts in the second guard ring.

9. The integrated circuit of claim 8, wherein the contacts comprise butting contacts, each butting contact being in electrical connection with a pair of adjacent first well region and second well region.

10. The integrated circuit of claim 1, wherein the first conductivity type is P-type and the second conductivity type is N-type.

11. A method for forming an integrated circuit, comprising:
    providing a semiconductor layer of a first conductivity type and being lightly doped;
    forming an active device in the semiconductor layer, the active device being formed at least partially on a first buried layer of a second conductivity type;

forming a first guard ring of the first conductivity type in the semiconductor layer surrounding at least part of the active device;

forming a second guard ring in the semiconductor layer surrounding the first guard ring and the active device and comprising first well regions of the first conductivity type interleaved with second well regions of the second conductivity type, the first well regions and the second well regions being interleaved to form alternating first and second well regions along a path where the second guard ring surrounds the first guard ring and the active device, the first well regions and the second well regions being formed on a second buried layer of the second conductivity type, the first and second well regions being electrically shorted together and electrically coupled to a ground potential or floating; and forming a third guard ring of the first conductivity type in the semiconductor layer surrounding the second guard ring, wherein the first and third guard rings do not receive direct electrical connection and are biased to the same electrical potential as the second well regions of the first conductivity type in the second guard ring.

12. The method of claim 11, wherein forming first, second and third guard rings comprises:
    forming the first, second and third guard rings as concentric closed loop rings surrounding the active device.

13. The method of claim 11, wherein forming first, second and third guard rings comprises:
    forming the first, second and third guard rings as concentric open loop rings surrounding at least part of the active device.

14. The method of claim 11, wherein forming first and third guard rings comprises:
    forming a well region of the first conductivity type on a third buried layer of the first conductivity type; and
    forming a heavily doped region of the first conductivity type in the well region.

15. The method of claim 11, wherein forming the second guard ring comprises:
    forming a deep well region of the second conductivity type as the second well regions, the deep well region extending to the second buried layer; and
    forming a heavily doped region of the second conductivity type in the deep well region.

16. The method of claim 15, wherein forming the second guard ring further comprises:
    forming a standard well region of the second conductivity type in the deep well region, the heavily doped region of the second conductivity type being formed in the standard well region.

17. The method of claim 15, wherein forming the second guard ring further comprises:
    forming a heavily doped region of the first conductivity type in each first well region of the second guard ring.

18. The method of claim 17, wherein forming the second guard ring further comprises:
    forming contacts in electrical contact with the heavily doped regions of first well regions and the second well regions; and
    forming a conductive layer electrically connecting the contacts in the second guard ring.

19. The method of claim 18, wherein forming contacts in electrical contact with the heavily doped regions of first well regions and the second well regions comprises:
    forming butting contacts, each butting contact being in electrical connection with a pair of adjacent first well region and second well region.

20. The method of claim 11, wherein the first conductivity type is P-type and the second conductivity type is N-type.

* * * * *